(12) United States Patent
Bertin

(10) Patent No.: US 10,416,697 B2
(45) Date of Patent: Sep. 17, 2019

(54) WHEATSTONE BRIDGE SENSING SYSTEM WITH MULTIPLE CURRENT SOURCES

(71) Applicant: SEMICONDUCTOR COMPONENTS INDUSTRIES, LLC, Phoenix, AZ (US)

(72) Inventor: Jacques Jean Bertin, Pocatello, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 268 days.

(21) Appl. No.: 15/262,259

(22) Filed: Sep. 12, 2016

(65) Prior Publication Data

US 2017/0108884 A1    Apr. 20, 2017

Related U.S. Application Data

(60) Provisional application No. 62/241,330, filed on Oct. 14, 2015.

(51) Int. Cl.
| | | |
|---|---|---|
| *H02J 1/10* | (2006.01) | |
| *G05F 1/644* | (2006.01) | |
| *G01D 5/16* | (2006.01) | |
| *G01L 1/22* | (2006.01) | |
| *H03M 1/12* | (2006.01) | |
| *G01R 17/10* | (2006.01) | |

(52) U.S. Cl.
CPC ............... *G05F 1/644* (2013.01); *G01D 5/16* (2013.01); *G01L 1/2262* (2013.01); *H03M 1/12* (2013.01); *G01R 17/105* (2013.01)

(58) Field of Classification Search
CPC .......... G05F 1/644; G01L 1/2262; G01D 5/16
See application file for complete search history.

(56) References Cited

U.S. PATENT DOCUMENTS

| | | | | |
|---|---|---|---|---|
| 5,187,482 A * | 2/1993 | Tiemann | ............... | H03M 3/476 341/139 |
| 2013/0093431 A1* | 4/2013 | Raman | .................... | G01L 1/144 324/537 |
| 2014/0260646 A1* | 9/2014 | Rothman | ............... | G01H 11/06 73/719 |
| 2015/0020592 A1* | 1/2015 | Choi | ....................... | G01P 15/12 73/514.33 |

(Continued)

OTHER PUBLICATIONS

Sayed Javad Azhari, "AZKA Cell, the Current-Mnode Alternative of Wheatstone Bridge," IEEE Transactions on Circuits and Systems—I: Fundamental Theory and Applications, vol. 47, No. 9, Sep. 2000, pp. 1277-1284.

(Continued)

*Primary Examiner* — Rexford N Barnie
*Assistant Examiner* — Rasem Mourad
(74) *Attorney, Agent, or Firm* — Wash Park IP Ltd.; John T. Kennedy

(57) ABSTRACT

A system, in some embodiments, comprises: a multi-resistor Wheatstone bridge supplied by a first current source; and a second current source coupled to the bridge and configured to at least partially compensate for a voltage detected by an analog-to-digital converter (ADC), said voltage indicative of an alteration of a physical parameter affecting the bridge, wherein the ADC produces a digital code that represents said voltage.

20 Claims, 5 Drawing Sheets

(56) References Cited

U.S. PATENT DOCUMENTS

2016/0154031 A1* 6/2016 Masson ................ G01D 3/036
2017/0131333 A1* 5/2017 Schapendonk ........ G01R 19/25

OTHER PUBLICATIONS

Vittorio Comino et al., "A First-Order Current-Steering Sigma-DeltaModulator," IEEE Journal of Solid-State Circuits, Vo. 26, No. 3, Mar. 1991, pp. 176-183.
Chaiya Tanaphatsiri et al., "A Current-Mode Wheatstone Bridge Employing Only Single DO-CDTA," IEEE Circuits and Systems, 2008, pp. 1494-1497.

* cited by examiner

WHEATSTONE BRIDGE SENSING SYSTEM WITH MULTIPLE CURRENT SOURCES

CROSS-REFERENCE TO RELATED APPLICATIONS

This non-provisional application claims priority to U.S. Provisional Application No. 62/241,330, filed on Oct. 14, 2015 and incorporated herein by reference.

BACKGROUND

One common use for the Wheatstone bridge is to detect changes in physical parameters affecting the bridge. Such changes in physical parameters affect one or more resistances in the bridge, and, in turn, the altered bridge resistances cause a change in the voltage across opposing nodes of the bridge. Thus, the voltage across the bridge may be monitored to detect changes in one or more physical parameters affecting the bridge. The signal processing circuitry required to be used in tandem with such Wheatstone bridges, however, is complex and consumes excessive space and power.

SUMMARY

At least some of the embodiments disclosed herein are directed to a system, comprising: a multi-resistor Wheatstone bridge supplied by a first current source; and a second current source coupled to the bridge and configured to at least partially compensate for a voltage detected by an analog-to-digital converter (ADC), said voltage indicative of an alteration of a physical parameter affecting the bridge, wherein the ADC produces a digital code that represents said voltage. One or more of these embodiments may be supplemented using one or more of the following concepts, in any order and in any combination: wherein the second current source is digitally programmable based on another digital code that represents said voltage; wherein said digital code has a higher resolution than said another digital code; further comprising a third current source coupled to the bridge and configured to at least partially compensate for an offset current present in the bridge; wherein the third current source sinks current received from a first node of the bridge and supplies current to a second node of the bridge; wherein said physical parameter comprises pressure applied to the bridge; wherein the second current source sinks current received from a first node of the bridge and supplies current to a second node of the bridge; wherein the second current source is configured to at least partially compensate for an offset current associated with the bridge.

At least some embodiments are directed to a system, comprising: a Wheatstone bridge having first and second nodes; a current source supplying current to said bridge; a static current source configured to at least partially compensate for an offset current associated with the bridge, if any; a variable current source configured to sink current received from the first node and to provide current to the second node; and an analog-to-digital converter (ADC) configured to detect a voltage indicative of an alteration of a physical parameter affecting the bridge and to affect the current provided by the variable current source based on the detected voltage, wherein the ADC is further configured to provide a digital code based on said detected voltage. One or more of these embodiments may be supplemented using one or more of the following concepts, in any order and in any combination: wherein the ADC comprises an integrator configured to integrate current received via the bridge, current produced by the static current source, and current produced by the variable current source; wherein the ADC further comprises at least one comparator to determine a polarity and amplitude of an output of said integrator; wherein the ADC further comprises a digital filter that converts an output of the at least one comparator to another digital code, and wherein said another digital code is usable to affect the current provided by the variable current source; wherein the ADC further comprises a decimation filter configured to produce said digital code using said another digital code, and wherein said digital code has a higher resolution than said another digital code; wherein said detected voltage is a difference between two other voltages; wherein the variable current source is digitally programmable; wherein the variable current source compensates for a portion of said offset current not compensated for by the static current source; wherein the physical parameter comprises pressure.

At least some embodiments are directed to a method, comprising: providing current from a first current source to a Wheatstone bridge; detecting a voltage indicative of an alteration of a physical parameter affecting the bridge; providing current from a second current source to the bridge based on the detected voltage; and providing a value, based on the detected voltage, that indicates said alteration of the physical parameter. One or more of these embodiments may be supplemented using one or more of the following concepts, in any order and in any combination: wherein providing current from said second current source to the bridge comprises providing a quantity of current sufficient to return said voltage to a predetermined value; further comprising providing current from a third current source to the bridge to at least partially compensate for an offset current associated with said bridge.

Figure 1:
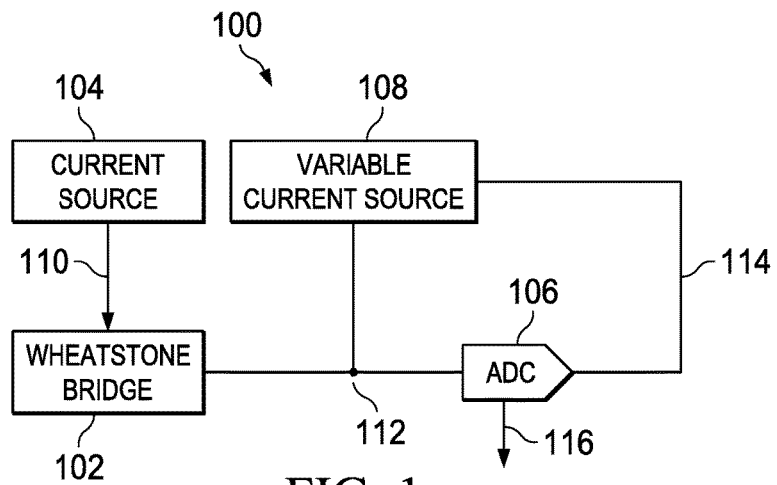
FIG. 1 is a block diagram of a Wheatstone bridge system including a variable current source.

It should be understood that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein is a Wheatstone bridge system with multiple current sources. In some embodiments, three separate current sources are used. One current source provides a static current supply to the Wheatstone bridge. A static current source is used to at least partially negate (i.e., compensate for) any current offset inherently present in the bridge—for instance, due to an unintentional imbalance of the resistors in the bridge. This current source sinks a current received from one bridge node and supplies to the bridge an identical current at the opposite bridge node. After at least some of the current offset has been compensated, an analog-to-digital converter (ADC) monitors the bridge for voltage (and, thus, current) imbalances. If detected, a voltage imbalance on the bridge signifies a mismatch of the resistor network on the bridge, which, in turn, indicates that a physical parameter (e.g., pressure) relating to the bridge has changed. The ADC detects the voltage and causes a third, digitally-controlled, variable current source to provide a dynamically variable current to compensate for the voltage detected at the ADC input. The ADC also produces a digital code indicating the detected voltage. This digital code reflects the degree of resistance mismatch at the bridge and, thus, the degree by which the physical parameter being monitored has changed. The digital code may be used as desired.

FIG. 1 is a block diagram of an illustrative Wheatstone bridge system 100. The bridge system 100 includes a Wheatstone bridge 102, a current source 104, an analog-to-digital converter (ADC) 106 (e.g., a first-order continuous time sigma-delta ADC), and a variable current source 108. The current source 104 couples to the bridge 102 via a connection 110. The bridge 102 couples to the variable current source 108 and the ADC 106 via a node 112. The ADC 106 couples to the variable current source 108 via an additional connection 114. The ADC 106 provides an output on connection 116. In some embodiments, the current source 104 comprises a static current source, meaning that it may provide a constant current with minimal, if any, variation (i.e., variation less than 5% from a baseline current).

The current source 104 provides current to the bridge 102, which comprises multiple resistors, as explained below. One or more of these resistors may change resistance value as a result of changes in one or more physical parameters affecting the bridge 102. For example, the resistances in the bridge 102 may be sensitive to changes in pressure applied to the bridge 102, and such pressure may cause the resistance value of one or more resistors in the bridge 102 to be altered. This change in bridge resistance alters a current or voltage in the bridge, and this alteration may be measured to detect changes in the physical parameter(s). In this manner, the bridge 102 acts as a sensor for one or more physical parameters.

As explained in greater detail below, the bridge 102 provides a current to node 112. The variable current source 108 sinks this current from the bridge 102 and provides another, dynamically variable current to the bridge 102. The current provided by the source 108 to the bridge 102 may serve multiple functions. First, this current may at least partially compensate (i.e., at least partially negate) any offset current that may be present in the bridge 102. The offset current (or offset voltage) may be present in the bridge 102 due to an imbalance in the resistor values of the bridge 102, despite efforts to balance the resistances. Second, after accounting for any offset that may be present in the bridge 102, there may still be a current flow from the bridge 102 as a result of an alteration in a physical parameter (e.g., pressure) affecting the bridge 102. Such an alteration affects one or more resistances in the bridge 102, which, in turn, causes a voltage to be present across a pair of output nodes in the bridge (and, thus, causes a current to flow from the bridge 102 to the node 112). The current from the variable current source 108 also attempts to compensate for this current from the bridge that is above and beyond the offset current, if any. Thus, in some embodiments, the variable current source 108 outputs a current that has two components: a static component that at least partially negates any bridge offset current, and a dynamically variable component that compensates for any remaining current above and beyond an offset current. As explained, this "remaining" current may be due to residual offset current and/or changes in the physical parameter(s) affecting the bridge 102.

The variable current source 108 compensates for these currents from the bridge 102 and seeks to balance the currents present on the node 112. Any imbalance of the currents on node 112 appears as a voltage at the input to the ADC 106. If the ADC 106 detects any voltage at its input (i.e., the voltage at the ADC input is any non-zero value), the ADC 106 generates a digital code and outputs the code on connection 114. (In some embodiments, the ADC 106 may still output a digital code of some type even when the voltage at the ADC input is zero.) The variable current source 108, which in at least some embodiments comprises a digitally programmable current source (e.g., comprising a digital-to-analog converter (DAC)), uses the digital code to adjust the current output to node 112. In this way, the ADC 106 constitutes part of a feedback loop that causes the voltage present at the ADC input to converge to zero volts, although in some embodiments, the ADC 106 may be programmed to target a different, predetermined, non-zero voltage at the ADC input. The ADC 106 additionally provides another digital code on connection 116. This digital code, which may be of a higher resolution than the digital code provided on connection 114, can be used for any suitable purpose—for instance, to determine the alteration of the physical parameter (e.g., pressure) applied to the bridge 102.

Figure 2:
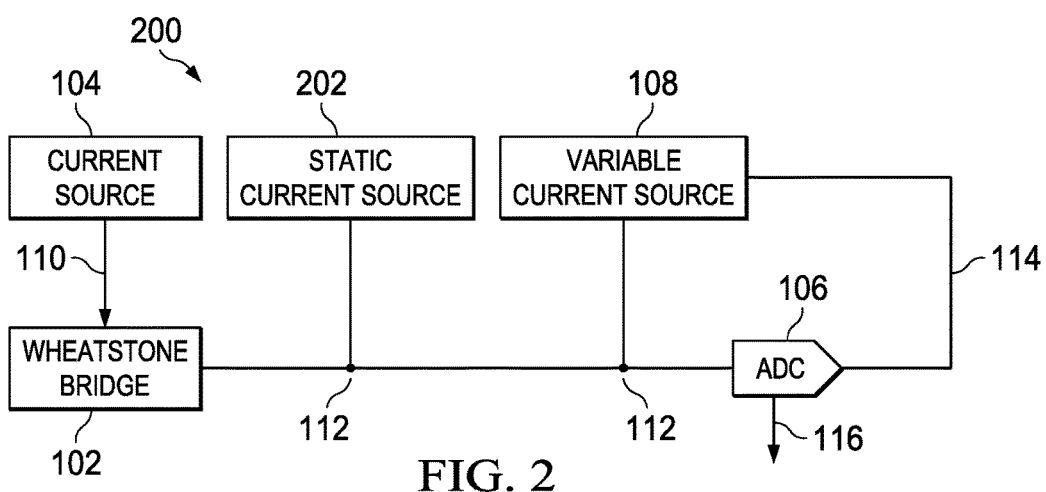
FIG. 2 is a block diagram of a Wheatstone bridge system with static and variable current sources.

FIG. 2 is a block diagram of an illustrative Wheatstone bridge system 200. The system 200 comprises a Wheatstone bridge 102; a current source 104 coupled to the bridge 102 via connection 110; and an ADC 106 coupled to the bridge 102, to a variable current source 108, and to a static current source 202 all via node 112. The system 200 additionally comprises a connection 114 between the ADC 106 and the variable current source 108. The system 200 further comprises an output 116 of the ADC 106.

The operation of the Wheatstone bridge system 200 is similar to that of the Wheatstone bridge system 100 of FIG. 1. However, the bridge system 200 comprises a static current source 202 that is omitted from the system 100 as depicted in FIG. 1. The static current source 202 may provide a constant current (e.g., no more than 5% variation) that negates, or at least partially negates, an offset current present in the bridge 102. Such an offset current may be present in the bridge 102 due to an imbalance in the bridge resistors, and the offset may persist despite careful attempts to balance the bridge resistors. The current provided by the static current source 202 may be set automatically upon detection of the offset current or, in at least some embodiments, the current may be set manually. The offset current from the bridge flows to the static current source 202 and is sunk by the static current source 202. In turn, the static current source 202 provides an output current to the bridge 102 that is identical to the sunk offset current. This current provided from the static current source 202 to the bridge 102 negates, or at least partially negates, the offset current present in the bridge 102.

Any remaining current from the bridge 102—such as current generated by a change in the physical parameter affecting the bridge 102, and such as any remaining offset current—causes a voltage to appear on node 112 at the input of the ADC 106. The ADC 106, connection 114, and the variable current source 108 function as a feedback loop to continually adjust the current provided by the variable current source 108 until the voltage at the input of the ADC 106 is brought as close to 0 V (or some other predetermined voltage) as possible. Stated another way, the variable current source 108 tracks any current from the bridge 102 above and beyond the current provided by the static current source 202. The current required from the variable current source 108 to negate the voltage at the input of the ADC 106 is represented by a digital code that is output at 116, which is fed back to the digitally programmable, variable current source 108. The digital code represents the degree of alteration of the physical parameter affecting the bridge 102. Thus, this digital code may be decoded and processed to determine the physical parameter affecting the bridge 102. In at least some embodiments, the static and variable current sources 202, 108 produce currents proportional to the current produced by the current source 104.

Figure 3:
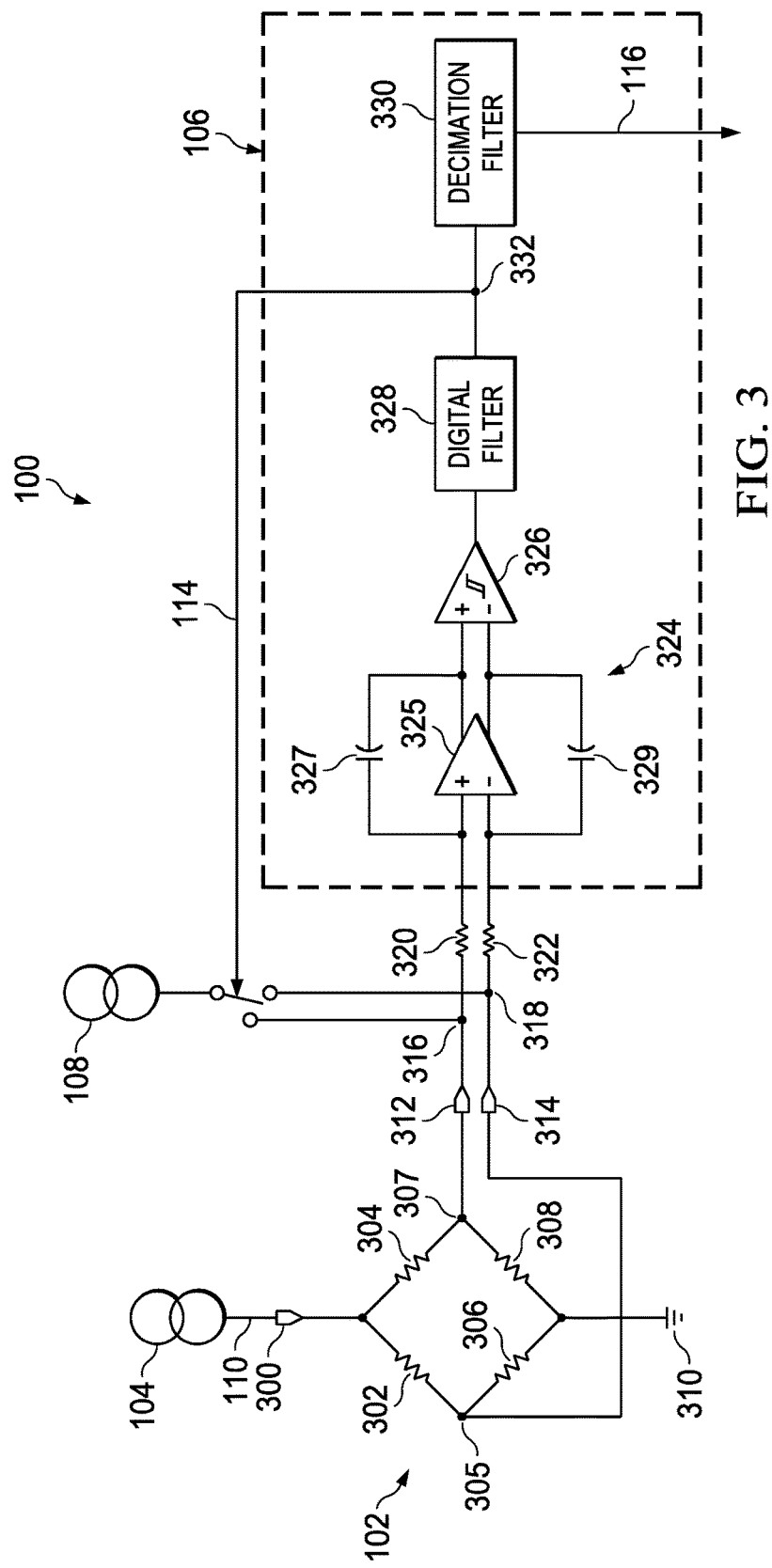
FIG. 3 is a circuit schematic of a Wheatstone bridge system including a variable current source.

FIG. 3 is a circuit schematic of the illustrative Wheatstone bridge system 100 of FIG. 1. Current source 104 provides current (e.g., between approximately 5 micro-amps to 5 milli-amps, inclusive) to the Wheatstone bridge 102 via the connection 110 and pin 300. The Wheatstone bridge 102 includes four resistors 302, 304, 306 and 308, as shown. The resistances may be chosen as desired, but in at least some embodiments, the total bridge resistance ranges between 1 kilo Ohm and 10 kilo Ohms. Further, in at least some embodiments, the resistors are balanced so that the voltage across nodes 305 and 307 is as close as possible to 0 V. The node between resistors 306 and 308 couples to ground. Node 307 couples to pin 312, and node 305 couples to pin 314. Pin 312 couples to node 316 and resistor 320 (e.g., 1 kilo Ohm to 10 kilo Ohms), and pin 314 couples to node 318 and resistor 322 (e.g., 1 kilo Ohm to 10 kilo Ohms) Nodes 316 and 318 couple to the variable current source 108. Specifically, the variable current source 108 sinks current flowing from one of the nodes (e.g., node 316), and the variable current source 108 sources (i.e., provides) current to the bridge 102 via the other node (e.g., node 318).

For example, in some embodiments, the nodes 316, 318 continuously sink a constant current (e.g., via a ground connection), and the amount of current sourced to those nodes is variable based on the digital signal received via connection 114 (described below). In some embodiments, when the bits in the digital signal received via connection 114 are all LOW, all current produced by the source 108 flows to only one of the two nodes (e.g., node 316). This may be the case because the switch coupled to the current source 108 may be composed of multiple (e.g., 256) bit cells, each bit cell corresponding to a bit in the digital signal received via connection 114. In some embodiments, when the bits in the digital signal received via connection 114 are mixed state, the current produced by the source 108 flows proportionally to each of the two nodes 316, 318, depending on the specific bits in the signal. In some embodiments, when the bits in the digital signal received via connection 114 are all HIGH, the current produced by the source 108 flows to only one of the two nodes (e.g., node 318). The net effect of these embodiments is that, depending on the signal bits received via connection 114, the net current sourced on each of the nodes 316, 318 may be positive, negative, or zero. The same or a similar technique is used for the switches and current sources depicted with respect to FIGS. 4 and 5 and described below.

The resistors 320 and 322 couple to the input of the ADC 106—and, more particularly, to the input of an integrator 324. The integrator 324 includes an operational amplifier 325 and feedback capacitors 327, 329. The integrator 324 integrates the sum of the currents provided by the bridge 102 and the variable current source 108. The output of the integrator 324 couples to a comparator 326, which determines the sign and amplitude of the output of the integrator 324. The output of the comparator 326 couples to a digital filter 328, which comprises an up-down counter and a high-pass filter. The digital filter 328 converts the output of the comparator 326 to a digital code (e.g., a 6-to-8 bit digital code) that is provided to the variable current source 108 via node 332 and connection 114. The digital filter 328 comprises an up/down counter and a high pass filter. The high pass filter bandwidth is set so that the closed loop system formed by the integrator 324, ADC 106, digital filter 328 and variable current source 108 is stable. In turn, the variable current source 108 produces a current on node 316 or node 318 based at least in part on the digital code provided to it. In some embodiments, the variable current source 108 may have a baseline current output that is static and that is matched to the offset current present in the bridge 102. The variable current is added to the baseline current output to produce a current that may at least partially negate the bridge offset current and that may resolve any voltage present at the input of the ADC 106.

The variable current source 108 has a high switching frequency (e.g., in the range of 1-100 MHz). Stated another way, the frequency with which the variable current source 108 switches between different digital codes—and, thus, between different output currents—is substantial. However, there is unlikely to be a single digital code at the 6-to-8 bit resolution level that will produce a current from the variable current source 108 that will perfectly resolve the voltage at the input to the ADC 106. In other words, the voltage at the input to the ADC 106 likely will never be exactly 0 V (or the predetermined, non-zero voltage intended for the input of the ADC 106). Instead, the variable current source 108 will repeatedly toggle between two (likely contiguous) digital codes as it attempts to resolve the voltage at the input to the ADC 106. The decimation filter 330 (e.g., a low-pass filter) produces a running average of these codes between which the variable current source 108 toggles, and it outputs this average value at 116. For example, if, within a defined period of time, the digital filter 328 toggles between two different digital codes with 50% of the time period spent outputting the first digital code and 50% of the time period spent outputting the second digital code, the average produced by the decimation filter 330 would be a digital code exactly in between these two digital codes.

The average value is a digital code that has a higher resolution (e.g., 12 bit to 14 bit) than the digital code produced by the digital filter 328. This high-resolution digital code may be used, e.g., to determine the alteration of the physical parameter, such as pressure, affecting the resistance of the bridge 102. In some embodiments, the decimation filter 330 outputs its digital codes at a lower frequency than the digital filter 328 (e.g., between approximately 5 to 20 kilo Hertz).

Figure 4:
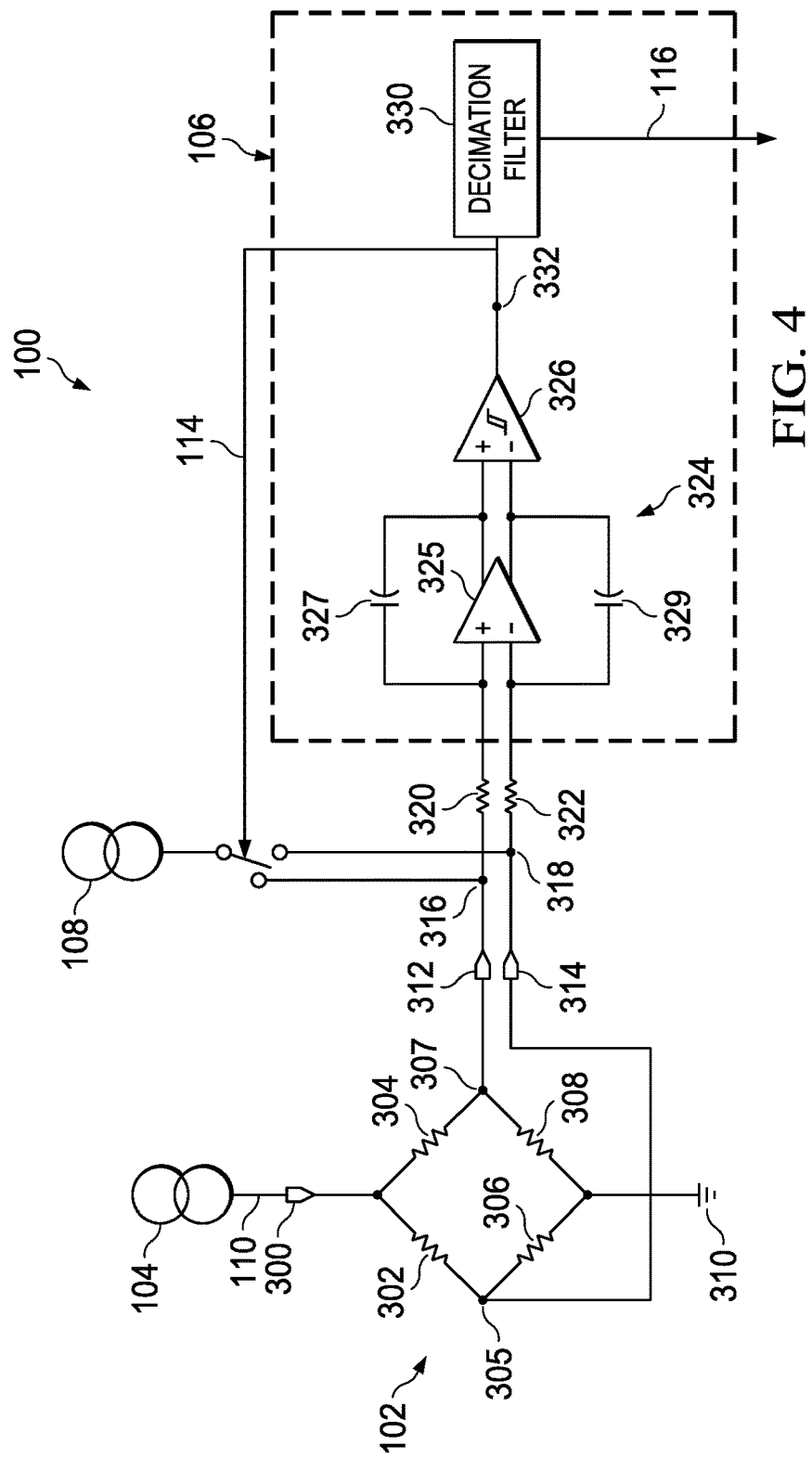
FIG. 4 is a circuit schematic of another Wheatstone bridge system including a variable current source.

As shown in FIG. 4, in some embodiments, the output of the comparator 326 may be coupled directly to the variable current source 108 and to the decimation filter 330, and the digital filter 328 may be removed. In such embodiments, the sign comparison of the comparator 326 is used, but amplitude measurements are not used.

Figure 5:
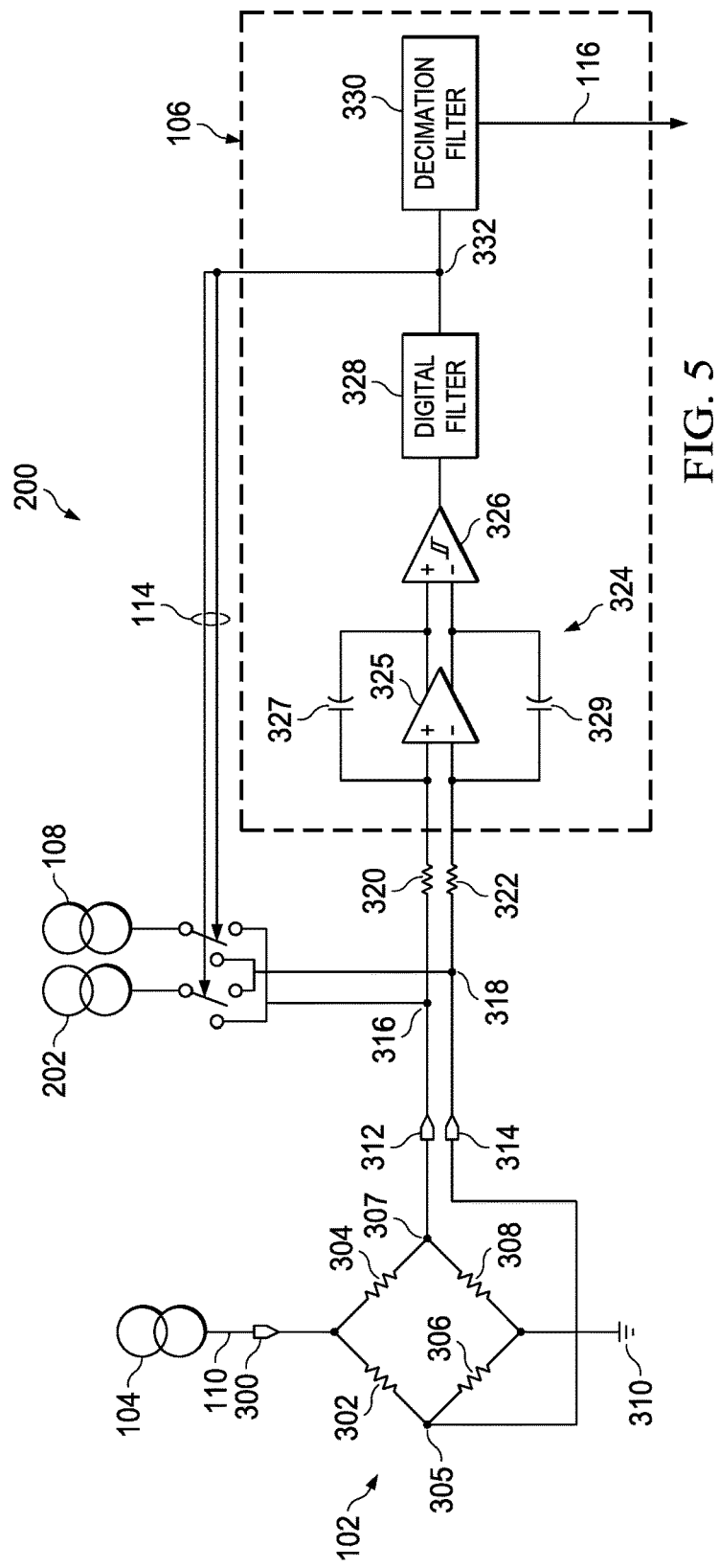
FIG. 5 is a circuit schematic of a Wheatstone bridge system with static and variable current sources.

FIG. 5 is a circuit schematic of the illustrative Wheatstone bridge system 200 of FIG. 2. The foregoing discussion with reference to FIGS. 3 and 4 about the Wheatstone bridge system 100 applies to the system 200 depicted in FIG. 5. However, the system 200 differs from the system 100 in that the system 200 comprises separate current sources 202 and 108. The current source 202 is a static current source, and it at least partially compensates for any offset current present in the bridge 102. The output of the static current source 202 may be fixed automatically or manually. It couples to nodes 316 and 318 via a switching mechanism controlled by the digital code on connection 114, and it may receive and sink current from one of these nodes (e.g., node 316) and it may provide current to the bridge 102 via the other node (e.g., node 318). In some embodiments, the current output by the static current source 202 is the same as the current that the static current source 202 sinks. This fully or at least partially negates/compensates for the bridge offset current. The variable current source 108 also sinks and sources currents via nodes 316 and 318 using a switching mechanism as previously shown in FIGS. 3 and 4, but its output current varies depending on the digital code that it receives from the digital filter 328. The operation of the variable current source 108 in system 200 is substantially similar to that of the variable current source 108 of system 100. One difference in operation, however, is the fact that the variable current source 108 of system 100 alone negates any bridge offset current, whereas that function is handled exclusively by the static current source 202 in system 200, or, alternatively, in a shared-duty arrangement between the current sources 202, 108 in the system 200.

Figure 6:
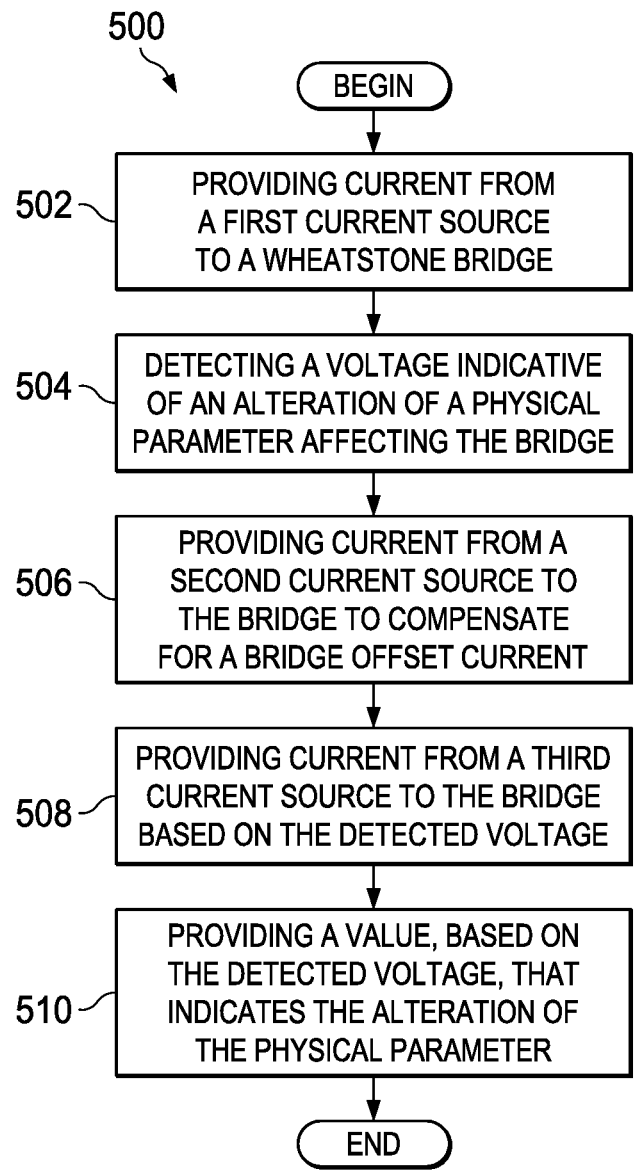
FIG. 6 is a flow diagram of a method of operation for a Wheatstone bridge system in accordance with various embodiments.

FIG. 6 is a flow diagram of an illustrative method 500 of operation for a Wheatstone bridge system in accordance with various embodiments. The method 500 begins by providing current from a first current source to a Wheatstone bridge (step 502). The method 500 next comprises detecting voltage indicative of an alteration of a physical parameter affecting the bridge (step 504). The method 500 subsequently includes providing current from a second current source to the bridge to at least partially compensate for a bridge offset current, if any (step 506). The method 500 further comprises providing current from a third current source to the bridge based on the detected voltage (step 508). As explained above, this third current source is a variable, digitally-programmable current source. Finally, the method 500 includes providing a digital value, based on the detected voltage, that indicates the alteration of the physical parameter (step 510). The method 500 may be modified as desired, including by adding, deleting, modifying or rearranging one or more steps.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

What is claimed is:

1. A system, comprising:
a multi-resistor Wheatstone bridge;
   wherein the bridge includes a first node, a second node, a third node, and a fourth node;
      wherein a first resistor couples the first node with the second node;
      wherein a second resistor couples the first node with the third node;
      wherein a third resistor couples the second node with the fourth node;
      wherein a fourth resistor couples the third node with the fourth node;
   wherein the bridge is supplied at the first node by a first current source and at the fourth node is continually and directly grounded; and
an analog-to-digital converter (ADC) configured to
   detect a voltage arising across the second node and the third node; and
   based on the detected voltage, output a first digital code;
a second current source coupled to the bridge via each of the second node and the third node, coupled to receive the first digital code from the ADC, and configured to at least partially compensate for the voltage based on the first digital code; and
wherein the voltage is indicative of an alteration of a physical parameter affecting the bridge.

2. The system of claim 1,
wherein the second current source is digitally programmable based on a second digital code that represents the voltage.

3. The system of claim 2,
wherein the first digital code has a higher resolution than the second digital code.

4. The system of claim 1, further comprising
a third current source coupled to the bridge and configured to at least partially compensate for an offset current present in the bridge.

5. The system of claim 4,
wherein the third current source sinks current received from the first current source at the first node of the bridge and supplies current to the second node of the bridge.

6. The system of claim 1,
wherein the physical parameter comprises pressure applied to the bridge.

7. The system of claim 1,
wherein the second current source sinks current received from the first current source at the first node of the bridge and supplies current to the second node of the bridge.

8. The system of claim 1,
wherein the second current source is configured to at least partially compensate for an offset current associated with the bridge.

9. A system, comprising:
a Wheatstone bridge having a first node, a second node, a third node and a fourth node;
   wherein the fourth node is continually and directly coupled to ground;
      wherein a first resistor couples the first node with the second node;
      wherein a second resistor couples the first node with the third node;
      wherein a third resistor couples the second node with the fourth node;
      wherein a fourth resistor couples the third node with the fourth node;
a first current source supplying current to the first node of the bridge;
a static current source configured to at least partially compensate for an offset current associated with the bridge, if any;
a variable current source configured to sink current received from the second node and to provide current to the third node; and an analog-to-digital converter (ADC) configured to detect a voltage indicative of an alteration of a physical parameter affecting the bridge and to affect the current provided by the variable current source based on the detected voltage;
wherein the detected voltage arises across the second node and the third node;
wherein the ADC is further configured to provide a first digital code based on the detected voltage.

10. The system of claim 9,
wherein the ADC comprises an integrator configured to integrate current received via the bridge, current produced by the static current source, and current produced by the variable current source.

11. The system of claim 10,
wherein the ADC further comprises at least one comparator to determine a polarity and amplitude of an output of the integrator.

12. The system of claim 11,
wherein the ADC further comprises a digital filter that converts an output of the at least one comparator to a second digital code, and
wherein the digital filter outputs the second digital code to the variable current source; and
wherein the variable current source is configured to adjust the sink current based on the second digital code.

13. The system of claim 12,
wherein the ADC further comprises a decimation filter configured to produce the first digital code using the second digital code, and
wherein the first digital code has a higher resolution than the second digital code.

14. The system of claim 9,
wherein the detected voltage is a difference between two other voltages.

15. The system of claim 9,
wherein the variable current source is digitally programmable.

16. The system of claim 9,
wherein the variable current source compensates for a portion of the offset current not compensated for by the static current source.

17. The system of claim 9,
wherein the physical parameter comprises pressure.

18. A method, comprising:
providing a first current from a first current source to first node of a Wheatstone bridge;
　wherein a first resistor couples the first node with a second node;
　wherein a second resistor couples the first node with a third node;
　wherein a third resistor couples the second node with a fourth node;
　wherein a fourth resistor couples the third node with the fourth node;
wherein the bridge is continually and directly grounded at the fourth node;
detecting a voltage indicative of an alteration of a physical parameter affecting the bridge;
　wherein the voltage is detected across the second node and the third node;
providing a second current from a second current source to the bridge based on the detected voltage; and
providing, by an analog-to-digital converter to the second current source, a value, based on the detected voltage, that indicates the alteration of the physical parameter;
wherein the second current source adjusts the second current based on the value received from the analog-to-digital converter.

19. The method of claim 18,
wherein providing current from the second current source to the bridge comprises providing a quantity of current sufficient to return the detected voltage to a predetermined value.

20. The method of claim 18, further comprising
providing current from a third current source to the bridge to at least partially compensate for an offset current associated with the bridge.

* * * * *